United States Patent
Fukunaga

(10) Patent No.: US 6,174,173 B1
(45) Date of Patent: Jan. 16, 2001

(54) IC SOCKET

(75) Inventor: Masami Fukunaga, Kawaguchi (JP)

(73) Assignee: Enplas Corporation, Saitama-ken (JP)

( * ) Notice: Under 35 U.S.C. 154(b), the term of this patent shall be extended for 0 days.

(21) Appl. No.: 09/258,089

(22) Filed: Feb. 24, 1999

(30) Foreign Application Priority Data

Feb. 25, 1998 (JP) .................................................. 10-062228

(51) Int. Cl.[7] ...................................................... H01R 9/09
(52) U.S. Cl. ................................................ 439/71; 439/68
(58) Field of Search ............................. 439/70, 266, 330, 439/525, 524, 68, 71, 73, 331, 67, 72–77

(56) References Cited

U.S. PATENT DOCUMENTS

| | | | |
|---|---|---|---|
| 4,969,828 | * 11/1990 | Bright et al. | 439/68 |
| 5,131,852 | * 7/1992 | Grabbe et al. | 439/71 |
| 5,481,435 | * 1/1996 | Werther | 361/784 |
| 5,612,514 | * 3/1997 | Lam | 174/261 |
| 5,883,788 | * 3/1999 | Ondricel et al. | 361/768 |

FOREIGN PATENT DOCUMENTS 09129329  5/1997 (JP) .

\* cited by examiner

Primary Examiner—Brian Sircus
Assistant Examiner—Son V. Nguyen
(74) Attorney, Agent, or Firm—Fish & Richardson PC

(57) ABSTRACT

An IC socket is provided with an IC package which is to be connected to a printed circuit board. The IC socket includes a terminal socket, to be connected to the printed circuit board to establish an electrical connection therebetween, an intermediate connector, such as tab film, which is mounted on the terminal socket, and on which the IC package is to be mounted. The intermediate connector is provided with an IC package side surface, on which an electrode pattern adapted to be joined to a terminal arrangement of the IC package is formed, and another terminal socket side surface on which contact terminals to be connected to the terminal socket are formed. The intermediate connector is further provided with a circuit for connecting the electrode pattern and the contact terminals. The IC socket includes a press jig for pressing the IC package mounted on the intermediate connector against the intermediate connector and a fastening assembly composed of bolt and nut assemblies for detachably fastening the press jig, the intermediate connector and the terminal socket, in this order, so as to establish an electrical connection between the IC package and the terminal socket through the intermediate connector.

10 Claims, 3 Drawing Sheets

IC SOCKET

BACKGROUND OF THE INVENTION

1. Field of the Invention

The present invention relates to an IC socket, to which is mounted an IC package is adapted to be electrically connected to a printed circuit board.

2. Prior Art of the Invention

A known IC socket of this type is shown in FIG. 4, for example, and with reference to FIG. 4, an IC socket 1 has a structure to be mounted to a printed circuit board 2. The IC socket 1 holds an IC package 3, which is to be electrically connected to the printed circuit board 2.

The IC socket 1 has a socket body 4 into which a plurality of contact pins, not shown, are arranged. The contact pins have lead portions projecting downward, in a state shown in FIG. 4, and the lead portions are inserted into through holes 2a of a circuit pattern printed on the printed circuit board 2 so as to establish an electrical connection therebetween. As shown in FIG. 4, an attachment 5, a tab film 6 and a press jig 7 are integrally assembled by means of bolts 8, and the assembly is mounted in the socket body 4 to be detachable, thus constituting the IC socket 1.

An electrode pattern, which is hindered by the press jig 7 in the illustration of FIG. 4, is formed to a central portion of a front surface side thereof, the electrode pattern being electrically joined or connected to arrangement of terminals of the IC package 3. The contact terminals 6a, connected through the circuit, are arranged to the peripheral edge portion of the electrode pattern, and movable contact pieces of contact pins provided for the socket body 4 are connected to the upper surface of these contact terminals 6a so as to be connected to and separated from each other.

The press jig 7 is provided with a jig body 7a into which the IC package 3 is inserted and also provided with a pressing portion 7b which presses the upper surface of the inserted IC package 3, thereby contacting, under pressure, the terminals formed to the lower surface of the IC package 3 against the electrode pattern of the tab film 6.

According to the structure and the manner mentioned above, the contact terminals 6a formed to the peripheral edge portion of the tab film 6 is electrically connected to the printed circuit board 2 by way of contact pins.

In the conventional structure mentioned above, however, a number of contact pins are arranged in the socket body 4 and a mechanism for displacing or biasing the movable contact pieces of these contact pins are also arranged therein, so that the entire structure of the socket body 4 is made large in size and thus complicated, providing a problem.

SUMMARY OF THE INVENTION

An object of the present invention is to substantially eliminate defects or problems encountered in the prior art mentioned above and to provide an IC socket having a small-sized and compact structure.

This and other objects can be achieved according to the present invention by providing an IC socket to be connected to a printed circuit board, which comprises:

a terminal socket to be connected to the printed circuit board to establish an electrical connection therebetween;

an intermediate connector which is mounted on the terminal socket and on which an IC package is mounted, the intermediate connector being provided with one surface on an IC package side, on which an electrode pattern adapted to be joined to a terminal arrangement of the IC package is formed, and also provided with another one surface on a terminal socket side, on which a contact terminal means to be connected to the terminal socket are formed, the intermediate connector being further provided with a circuit for connecting the electrode pattern to the contact terminals;

a press means pressing the IC package mounted on the intermediate connector against the intermediate connector; and fastening means for detachably fastening the press means, the intermediate connector and the terminal socket in this order so as to establish an electrical connection between the IC package and the terminal socket through the intermediate connector.

In a preferred embodiment in the above aspect, the intermediate connector is supported by the terminal socket and the press means. The contact terminal means of the intermediate connector comprises a plurality of pin-shaped terminals to be inserted into the terminal socket. The intermediate connector has a thin sheet structure such as tab film. The intermediate connector has an area to which the terminal arrangement of the IC package is pressed and an elastic member having an elastic property is disposed to that area.

The press means comprises a press jig member having a jig body to which the IC package is mounted.

The terminal socket, the intermediate connector and the press means are formed with fastening holes having substantially the same size and positional arrangement and the fastening means comprises fastening bolts and nuts, the fastening bolts being inserted into the fastening holes for fastening the terminal socket, the intermediate connector and the press means together by the nuts.

There may be further provided a ball guide means interposed between the intermediate connector and the press means.

According to the structures and characters of the IC socket of the present invention mentioned above, the terminal socket is joined and connected to the circuit pattern of the printed circuit board so as to establish the electrical connection therebetween, the intermediate connector is mounted on the terminal socket, the IC package is mounted on the intermediate connector. Furthermore, the electrode pattern is formed to one surface of the intermediate connector in the above arrangement and the contact terminals are located to the other one surface thereof. Accordingly, the height of the entire structure of the IC socket can be reduced and made compact, and moreover, the structure thereof can be made simple because of no location of contact pins and displacing or biasing mechanism as used in a conventional structure. Furthermore, since the intermediate connector has a thin sheet shape such as tab film, the entire structure of the IC socket can be made further compact.

Still furthermore, the press jig, the intermediate connector and the terminal socket are fastened together to be detachably by the bolts and nuts, and the intermediate connector is merely interposed between the press jig and the terminal socket, so that the intermediate connector, which may be easily damaged, can be easily exchanged with new one when damaged.

Still furthermore, since the contact terminals of the intermediate connector are formed as pin-shaped terminals, the intermediate connector can be more easily attached or detached by inserting or withdrawing these pin-shaped terminals, and moreover, the electrical connection therebetween can be easily and surely established only by inserting the pin-shaped terminals into the terminal socket.

Still furthermore, since the intermediate connector such as tab film has a thin thickness and less elasticity, the location of the elastic member can ensure the electrical connection between the IC package and the intermediate connector.

The nature and further characteristic features of the present invention will be made more clear from the following descriptions made with reference to the accompanying drawings.

DESCRIPTION OF THE PREFERRED EMBODIMENTS

One preferred embodiment of the present invention will be described hereunder with reference to FIGS. 1 to 3.

Figure 1:
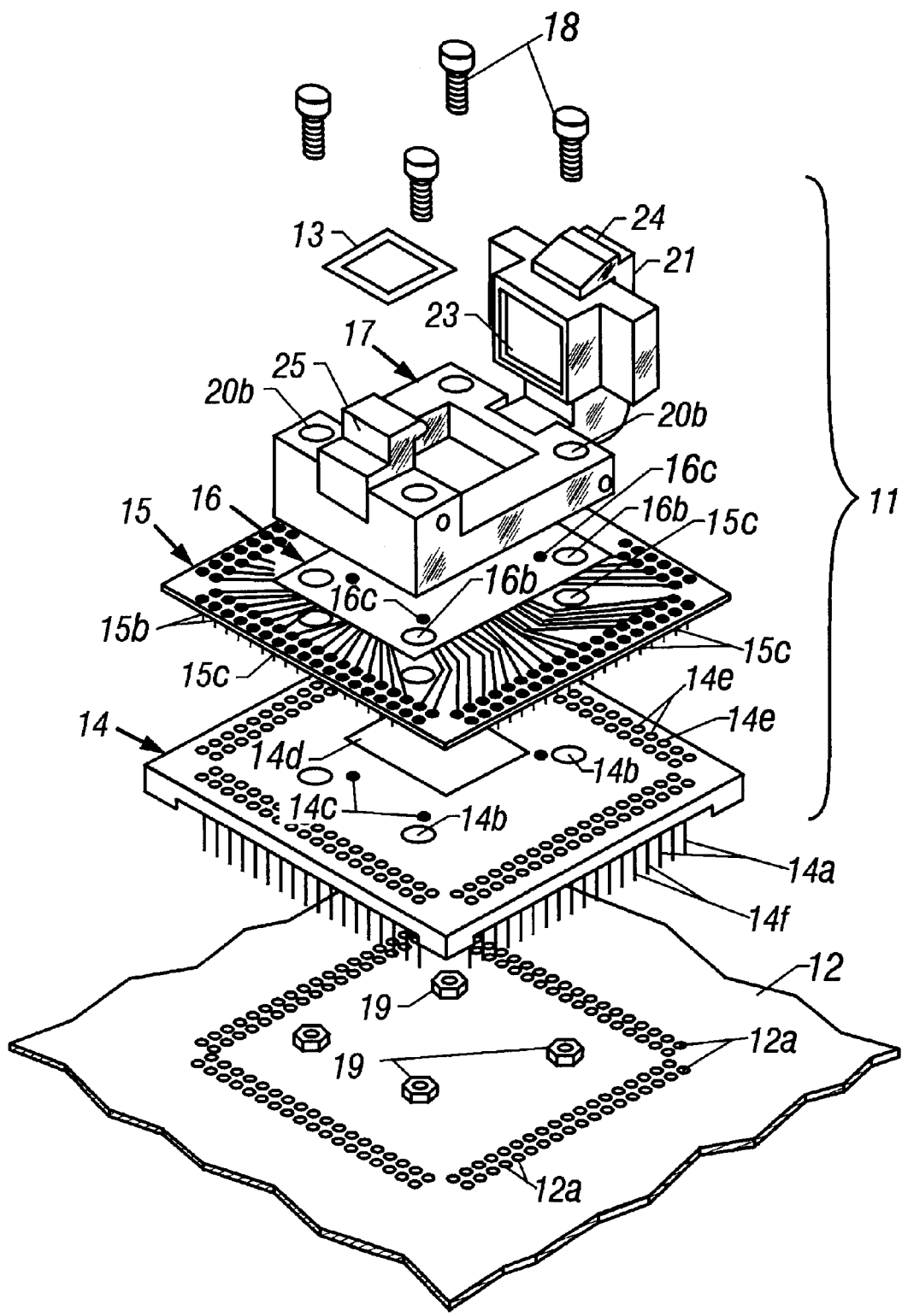
FIG. 1 is a developed perspective view of a printed circuit board and an IC socket of an embodiment according to the present invention.
Figure 2:
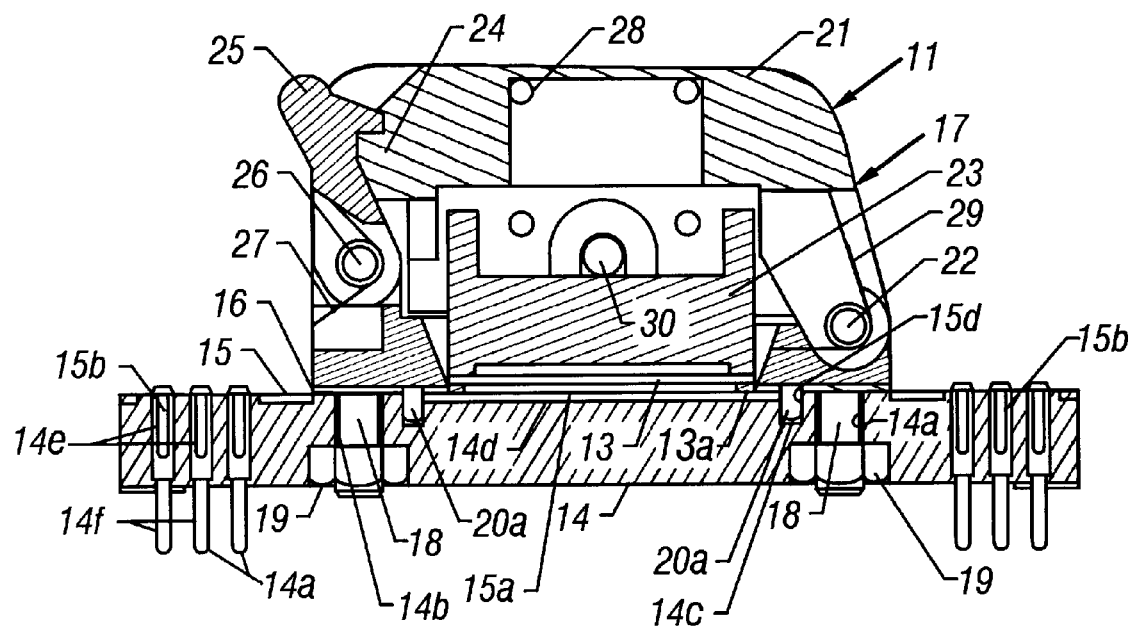
FIG. 2 is a sectional view showing the IC socket of the present embodiment in a state mounted to the printed circuit board.
Figure 3:
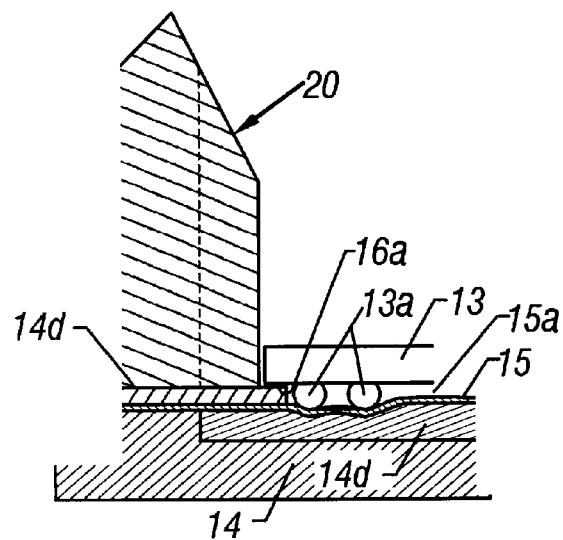
FIG. 3 is a sectional view showing an essential portion of the IC socket including a press jig body, a ball guide, tab film and a terminal socket.
Figure 4:
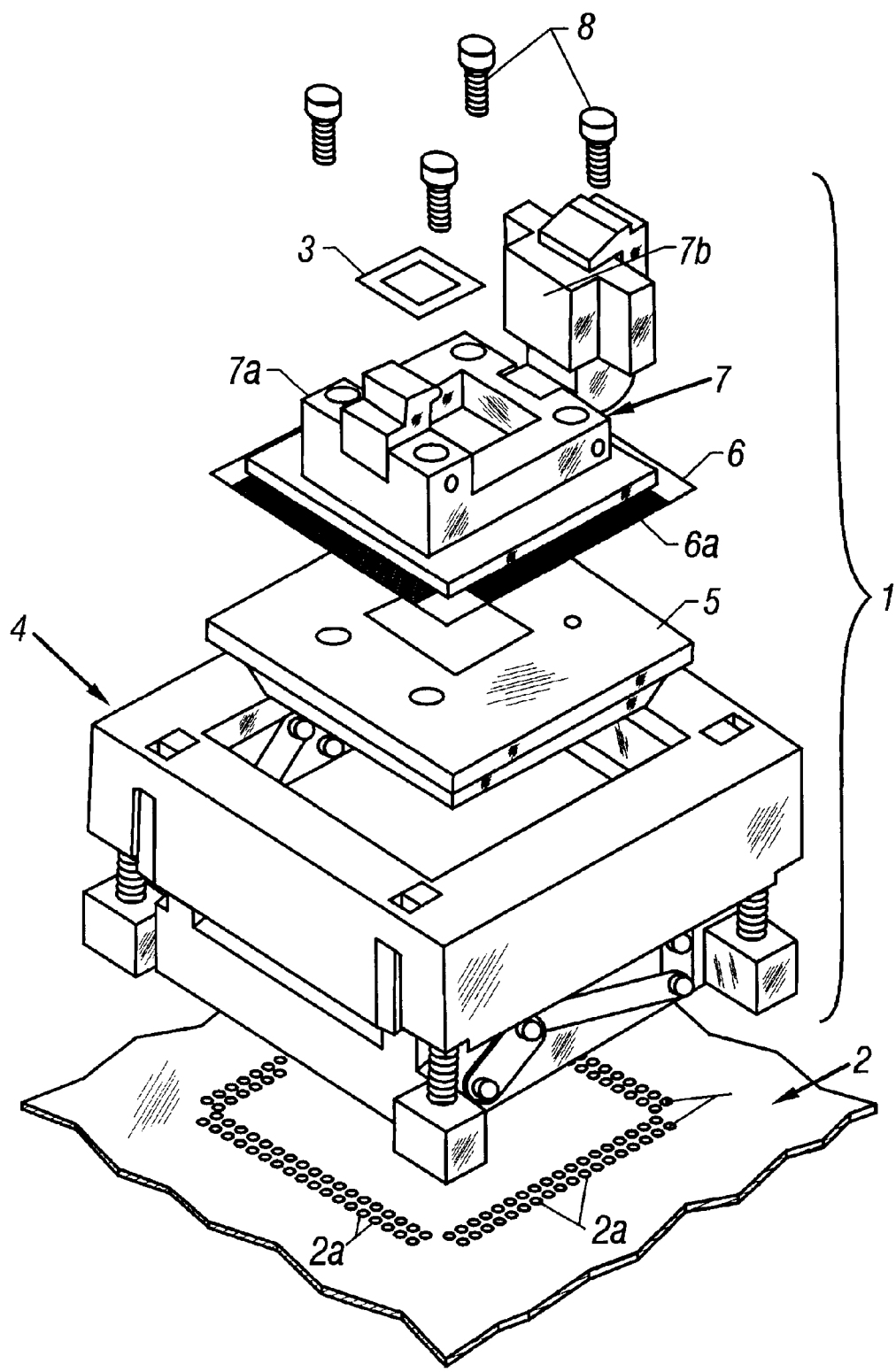
FIG. 4 is a developed perspective view of a printed circuit board and an IC socket of a conventional structure.

Referring to FIGS. 1 to 3, a reference numeral 11 denotes an IC socket according to the embodiment of the present invention, which is to be mounted on a printed circuit board 12, the IC socket 11 is electrically connected to the printed circuit board 12 through an IC package 13 held to the IC socket 11.

More specifically, the IC socket 11 comprises a terminal socket 14, a tab film 15 as an intermediate connector, a ball guide 16 for positioning the IC package 13 and a press jig 17, which are assembled in this order from the lower side in the structure shown in FIG. 1 to be detachable by means of bolts 18 and nuts 19 as fastening means.

The terminal socket 14 has a rectangular plate structure and a number of round pins 14a are arranged in two rows at four peripheral edge portions of the plate structure, and four bolt holes 14b and four positioning holes 14c are also formed to the terminal socket 14 inside the row arrangement of the pins 14a. An elastic member 14d formed of such as silicon having an elastic property is also disposed at the central portion of the terminal socket 14. The round pins 14a are firmly fitted into through holes formed to the terminal socket 14 in the thickness direction thereof in a manner that fitting recesses 14e are formed on the upper surface side of the terminal socket 14 and the free front ends 14f project downward from the lower surface of the terminal socket 14, the projecting front ends 14f being inserted into the through holes 12a of the printed circuit board 12 thereby to establish an electrical connection between the terminal socket 14 and the printed circuit board 12.

The tab film 15 also has a rectangular sheet-like structure having substantially the same size or dimension as that of the terminal socket 14. The tab film 15 is formed with electrode pattern 15a on one (front) surface, i.e. upper surface as viewed, thereof on the IC package 13 side, the electrode pattern 15a being joined or connected to the arrangement of the terminals 13a of the IC package 13. On the other hand, the tab film 15 is also provided, on the other (rear) surface, i.e. lower surface as viewed, on the terminal socket 14 side, with pin-shaped terminals 15b as contact terminals which are to be joined or connected to the terminal socket 14. The tab film 15 is further provided with a circuit for connecting the electrode pattern 15a and the pin-shaped contacts 15b. The pin-shaped contacts 15b have front (downward) ends each having a size capable of being fitted into the fitting recess 14e of the round pin 14a of the terminal socket 14. The tab film 15 is also formed with bolt holes 15c and positioning holes 15d corresponding to those 14b and 14c of the terminal socket 14, respectively, in size and arrangement.

The ball guide 16 is formed of a material having an insulating property and has a rectangular plate-like structure substantially corresponding to that of a press jig body 20 of the press jig 17. The ball guide 16 is also formed, at the central portion thereof, with a positioning opening 16a for positioning a peripheral portion of solder balls 13a as terminals of the IC package 13, and further provided with bolt holes 16b and positioning holes 16c corresponding to those 15c and 15d of the tab film 15, respectively, in size and arrangement. According to the formation of the positioning opening 16a, the solder ball 13a disposed to the most outer peripheral side of the IC package 13 can be accurately positioned as shown in FIG. 3. The press jig 17 has the jig body 20, as mentioned above, having a frame-shaped rectangular structure, to which a cover member 21 is mounted to be rotatable about a shaft or shaft pin 22 and urged by a spring 29 in a direction to be opened. A pushing member 23 for pushing the IC package 13 is attached to the cover member 21 to be swingable and vertically movable by a shaft 30, and the pushing member 23 is urged downward by a spring 28 disposed between the shaft 30 and the cover member 21. The cover member 21 is formed with a portion 24 to be engaged, and the press jig body 20 has a hook 25 which is engaged with the portion 24 of the cover member 21 and which is rotatable about a shaft 26. The hook 25 is urged by a spring 27 in a clockwise (engaging) direction in FIG. 2.

The jig body 20 has an inner hollow structure into which the rectangular IC package 13 is inserted, and the jig body 20 are mounted on the tab film 15 in a state inserted with the IC package 13. To the lower surface of the jig body 20, there are attached positioning pins 20a so as to project downward and to be fitted to the positioning holes 14c, 15d and 16c of the terminal socket 14, the tab film 15 and the ball guide 16, respectively. Bolt holes 20b are also formed to the jig body 20, which correspond to the bolt holes 16b of the ball guide 16 in size and arrangement.

The positioning pins 20a of the jig body 20 are fitted to the positioning holes 14c, 15d and 16c of the terminal socket 14, the tab film 15 and the ball guide 16, respectively, thereby to assemble these members with a predetermined positional relationship. Furthermore, the bolts 18 are inserted into the bolt holes 14b, 15c, 16b and 20b of the terminal socket 14, the tab film 15, the ball guide 16 and the jig body 20, respectively, and then are screw-fastened by the nuts 19, thus these members being fastened and fixed in a superposed manner.

Further, the elastic member 14d located to the central portion of the terminal socket 14 has an arrangement corresponding to an area to be pressed of the tab film 15 at which the arrangement of the terminals 13a of the IC package 13 is pressed.

The IC package 13 is set, in the following manner, to the IC socket 11 mounted on the printed circuit board 12 in the manner mentioned above.

First, under the condition of the cover member 21 of the jig body 17 being opened, the IC package 13 is inserted into the interior of the jig body 20 and then mounted on the tab film 15. At this time, the peripheral edge portion of the IC package 13 is guided along the inner wall section of the jig body 20 and the solder balls 13a of the IC package 13 are inserted into the positioning opening 16a of the ball guide 16, thus positioning the IC package 13 in the predetermined position as shown in FIG. 3.

Under this state, the respective terminals 13a of the IC package 13 contact the electrode pattern 15a of the tab film 15.

In the next process, as the cover member 21 of the press jig 17 is being closed, the engaging portion 24 of the cover member 21 is engaged with the hook 25, thus the cover member 21 being completely closed. In the completely closed state, the upper surface of the IC package 13 is pressed downward by the pushing member 23, the solder balls 13a of the IC package 13 are pressed against the electrode pattern 15a of the tab film 15, and the elastic member 14d is elastically deformed.

Through the above process, the IC package 13 can be electrically connected to the printed circuit board 12 by way of the tab film 15 and the terminal socket 14. In particular, when the location density of the number of balls 13a is made high, high precision working must be required to directly connect the solder balls 13a to the printed circuit board 12. Then, in such case, according to the present invention, the circuit portion is extended from the electrode pattern 15a disposed at the central portion of the tab film 15 toward the peripheral portion thereof and the pin-shaped terminals 15b are located to the peripheral edge portion thereof, so that the pin-shaped terminals 15b are arranged with pitches each being larger than that of the electrode pattern 15a. This matter will result in that the pitch of the round pins 14a of the terminal socket 14, that is, a pitch of the through holes 12a of the printed circuit board 12, can be widened, thereby easily manufacturing and assembling the IC socket.

As mentioned above, according to the IC socket 11 of the characters and structures of the present invention, the terminal socket 14 is joined and connected to the circuit pattern of the printed circuit board 12 so as to establish the electrical connection therebetween, the tab film 15 is mounted on the terminal socket 14, the IC package 13 is mounted on the tab film 15. Furthermore, the electrode pattern 15a is formed to one surface of the tab film 15 in the above arrangement and the pin-shaped terminals 15b as contact terminals are located to the other one surface thereof. Accordingly, the height of the entire structure of the IC socket 11 can be reduced and made compact, and moreover, the structure thereof can be made simple because of no location of contact pins and displacing or biasing mechanism as used in a conventional structure. Furthermore, since the tab film 15 has a thin sheet shape, the entire structure of the IC socket 11 can be made further compact.

Still furthermore, according to the IC socket of the present invention, the press jig 17, the tab film 15 and the terminal socket 14 are fastened together to be detachably by the bolts 18 and nuts 19, and the tab film 15 is merely interposed between the press jig 17 and the terminal socket 14, so that the tab film 15, which may be easily damaged, can be easily exchanged with new one when damaged.

Still furthermore, since the contact terminals of the tab film 15 are formed as pin-shaped terminals 15b, the tab film 15 can be more easily attached or detached by inserting or withdrawing these pin-shaped terminals 15b, and moreover, the electrical connection therebetween can be easily and surely established only by inserting the pin-shaped terminals 15b into the terminal socket 14.

Still furthermore, since the tab film 15 has a thin thickness and less elasticity, the location of the elastic member 14d can ensure the electrical connection between the solder balls 13a of the IC package 13 and the tab film 15.

It is to be noted that the present invention is not limited to the embodiment described above and many other changes and modifications may be made without departing from the scopes of the appended claims.

For example, in the above embodiment, the terminal socket 14, the tab film 15 and the press jig 17 are fastened and fixed together by means of the bolts 18 and the nuts 19, as fastening means, in a manner detachable from each other. However, in a preferred modification, the tab film 15 may be supported by an engaging piece integrally formed to the press jig 17 to be attached to or detached from the terminal socket 14. Furthermore, the terminal socket 14, the tab film 15 and the press jig 17 may be detachably assembled and fastened by preparing another independent engaging member which is capable of being engaged with the terminal socket 14 and the press jig 17. The pin-shaped terminals 15b as the contact terminals of the tab film 15 may be formed as press-contact type terminals.

What is claimed is:

1. An IC socket to be connected to a printed circuit board comprising:

a terminal socket to be connected to the printed circuit board to establish an electrical connection therebetween;

an intermediate connector which is mounted on the terminal socket and on which an IC package is mounted, said intermediate connector having a thin structure and being provided with one surface on an IC package side, on which an electrode pattern adapted to be joined to a terminal arrangement of the IC package is formed, and also provided with another one surface on a terminal socket side on which a contact terminal means to be connected to the terminal socket is formed, said intermediate connector being further provided with a circuit for connecting the electrode pattern and the contact terminal means;

a press means pressing the IC package mounted on the intermediate connector against the intermediate connector;

a guide member provided between the intermediate connector and the press means and adapted to position a terminal of the IC package; and fastening means for detachably fastening the press means, the guide member, the intermediate connector and the terminal socket in this order so as to establish an electrical connection between the IC package and the terminal socket through the intermediate connector.

2. An IC socket according to claim 1, wherein said intermediate connector is held by the terminal socket and the press means.

3. An IC socket according to claim 1, wherein said contact terminal means of the intermediate connector comprises a plurality of pin-shaped terminals to be inserted into the terminal socket.

4. An IC socket according to claim 1, wherein said intermediate connector is composed of a tab film having a sheet shape.

5. An IC socket according to claim 1, wherein said press means comprises a press jig member having a jig body to which the IC package is mounted.

6. An IC socket according to claim 1, wherein said terminal socket, said intermediate connector and said press means are formed with fastening holes having substantially the same size and positional arrangement and said fastening means comprises fastening bolts and nuts, said fastening bolts being inserted into the fastening holes for fastening the terminal socket, the intermediate connector and the press means together by said nuts.

7. An IC socket according to claim 1, wherein said guide member comprises a ball guide means.

8. An IC socket according to claim 1, wherein said intermediate connector having a thin structure comprises an area to which the terminal arrangement of the IC package is pressed, and wherein an elastic member having an elastic property is disposed to said area.

9. An IC socket according to claim 1, wherein said contact terminal means comprises pin-shaped terminals connected to the terminal socket, said electrode pattern is arranged to a central portion of the one surface of the intermediate connector and wherein said circuit is extended from the electrode pattern arranged to the central portion of the one surface of the intermediate connector toward a peripheral portion of the intermediate connector, said pin-shaped terminals being located to a peripheral edge portion of the circuit.

10. An IC socket according to claim 9, wherein said pin-shaped terminals are arranged with pitches each being larger than that of the electrode pattern.

* * * * *